United States Patent [19]

Raag

[11] 4,032,363

[45] June 28, 1977

[54] LOW POWER HIGH VOLTAGE THERMOPILE

[75] Inventor: Valvo Raag, Mountain View, Calif.

[73] Assignee: Syncal Corporation, Sunnyvale, Calif.

[22] Filed: Jan. 27, 1975

[21] Appl. No.: 544,363

[52] U.S. Cl. .................... 136/211; 136/201; 136/202; 136/205; 136/212; 136/239; 29/573
[51] Int. Cl.² ............................. H01V 1/30
[58] Field of Search .......... 136/202, 239, 201, 211, 136/212, 205; 29/573

[56] References Cited
UNITED STATES PATENTS

| | | |
|---|---|---|
| 3,261,079 | 7/1966 | Clingman, Jr. et al. ........... 136/201 |
| 3,626,583 | 12/1971 | Abbott et al. ..................... 136/212 |
| 3,781,176 | 12/1973 | Penn et al. ........................ 136/201 |
| 3,806,362 | 4/1974 | Reed et al. ....................... 136/201 |
| 3,821,053 | 6/1974 | Wilcox ............................... 29/573 |
| 3,874,935 | 4/1975 | Goslee et al. ..................... 136/212 |

Primary Examiner—Brooks H. Hunt
Attorney, Agent, or Firm—Limbach, Limbach & Sutton

[57] ABSTRACT

An electrical power generating array of a semiconductor, laminar structured thermopile for producing low values of electrical power at high values of direct output voltage and a method for its manufacture including the step of lapping opposed semiconductor layers bonded on opposite sides of a glass layer to achieve a predetermined thinness.

14 Claims, 18 Drawing Figures

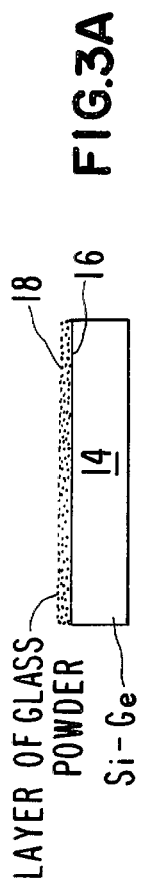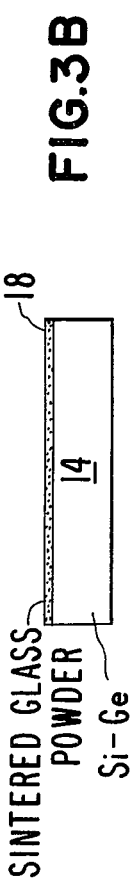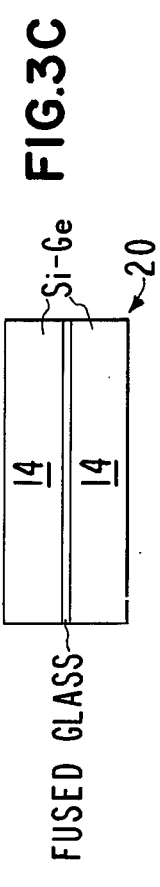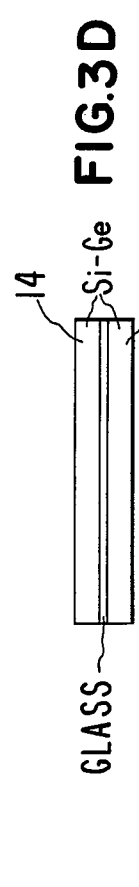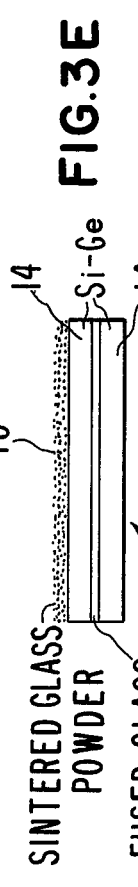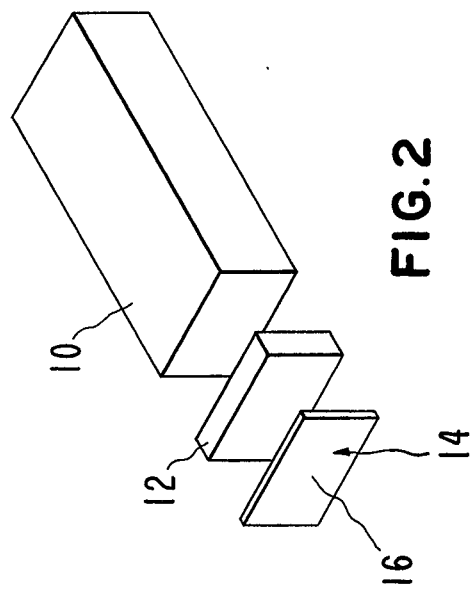

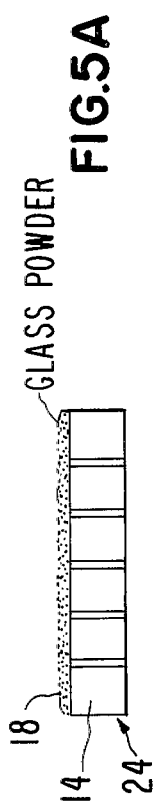
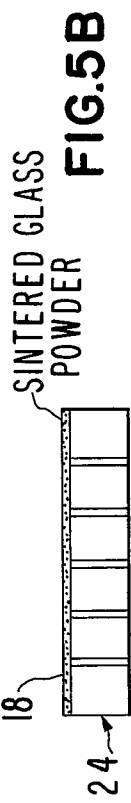
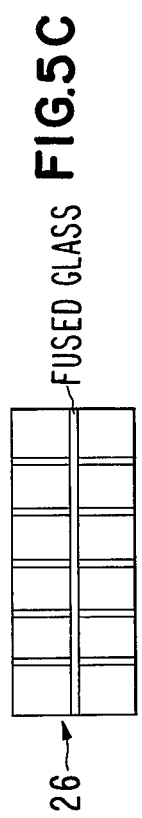
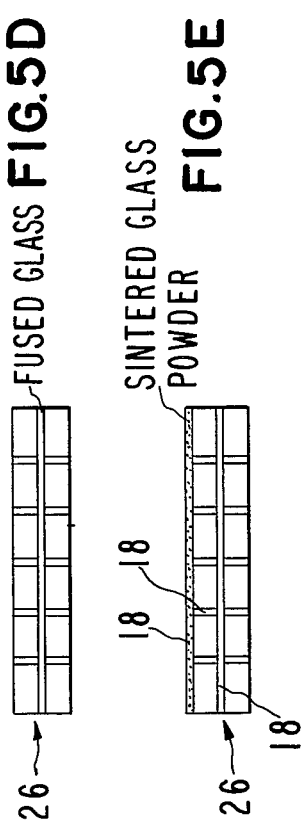
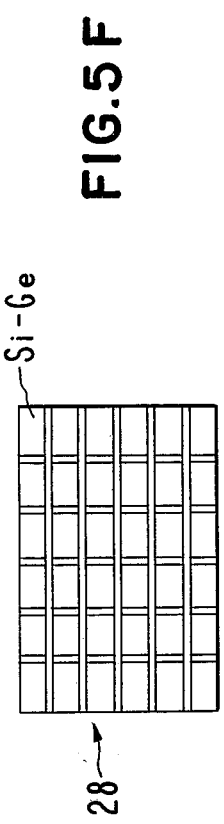
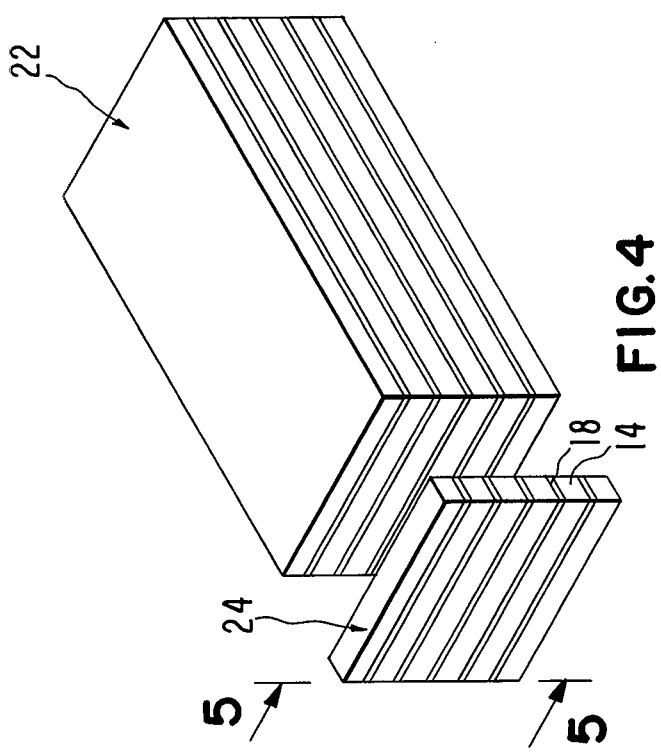

LOW POWER HIGH VOLTAGE THERMOPILE

BACKGROUND OF THE INVENTION

This invention relates to an array of thermocouples, hereafter referred to as "thermopile," that is used to produce electrical power by means of the principle commonly known as thermoelectricity, wherein a portion of heat traversing solid (or liquid) materials is converted to electricity and to the manufacture of such a thermopile. More particularly, the invention relates to a semiconductor thermopile and a method for its manufacture.

The production of electrical power from heat by means of thermoelectricity is a well known principle that is widely used in specialized applications. A device that produces electrical power by this means is known as a thermoelectric generator. A thermoelectric generator generally consists of a source of heat, either as an integral part or separate of the generator, a thermopile that is thermally coupled on one side to the heat source and on the other side to a heat sink, thermal insulation that minimizes extraneous heat losses and various structural members, including the outer case of the generator. A cold side heat exchanger that rejects waste heat is thermally connected to the outside of the thermoelectric generator and frequently is an integral part of the generator, especially when heat is rejected by radiation and/or by natural convection.

One prior art type of semiconductor thermopile consists of one or more electrically interconnected thermocouples, either in a series or in a parallel or in a series-parallel arrangement, wherein each thermocouple usually consists of two thermoelements, one possessing n-type and the other possessing p-type conductivity characteristics. N-type and p-type conductivity refer to common solid state physics terminology wherein the former conductivity refers to materials in which electrical conduction occurs primarily as a result of the movement of negative carriers, such as electrons, and wherein the latter conductivity refers to materials in which electrical conduction occurs primarily as a result of the movement of positive carriers, such as holes. The thermoelements of such themocouple are electrically interconnected at one side by means of an electrically conductive bridge or electrode. In the case of a single thermocouple, the electrical output of the thermocouple is obtained from approximate contacts placed at the opposite, non-interconnected ends of the thermocouple. The output contacts of the thermocouple are also electrically conductive and may be electrically interconnected to other thermocouples in the thermopile, if the thermopile consists of more than one thermocouple; in the case of a multi-thermocouple thermopile, the output terminals are connected to one ouput contact of each of at least two thermocouples. The thermopile may consist of a number of physically separated thermocouples that are electrically interconnected or it may consist of a monolithic matrix which contains more than one thermocouple and in which the thermocouples are mechanically or metallurgically attached to each other through an intermediate layer of electrical insulation and are electrically interconnected.

The dimensions and configuration of thermoelements in a thermocouple, and the number of thermocouples in a thermopile, are determined by detailed design considerations that include the electrical output power and voltage required of the thermopile, the amount of heat available and/or required by the thermopile, and the operating temperatures of the thermocouples in the thermopile. The efficiency of a thermoelectric generator is generally proportional to the temperature difference across the thermocouples of its thermopile and also to a quantity known as the "figure-of-merit" that depends on certain basic properties of the thermoelectric material used in the generator. For a given thermoelectric material and operating temperatures, the power produced by a thermoelectic generator is approximately proportional to the total cross-sectional area of the thermoelectric material contained by it; the output voltage of the generator is proportional to the number of series-connected thermocouples into which the thermoelectric material is subdivided. The required ratio of individual thermoelement length to cross-sectional area generally increases with decreasing values of power output because the desired voltage output values of a thermoelectric generator are relatively independent of the power output required of it.

Thus, for example, most thermoelectric generators that produce electrical power at power levels in the tens or even hundreds of watts require output voltages on the order of a few volts to a few tens of volts. Smaller thermoelectric generators, such as might be implanted in a human body to power a heart pace maker, for example, that produce electrical power in the microwatt or milliwatt power range generally are still required to produce voltages in the several-volt range. A reduction in the required power output by several orders of magnitude thus usually results in only a relatively modest reduction in the required voltage output. This of course means that although the total number of thermocouples in a generator that produces very small amounts of electrical power is nearly the same as in a generator that produces much more power, the total amount of thermoelectric material is significantly reduced. As a consequence, the ratio of the length to cross-sectional area of individual thermoelements in the former case is of course much more extreme than in the latter case. In fact, in the case of most commonly used thermoelectric materials, this ratio frequently becomes so extreme at power levels in the microwatt and low milliwatt range that it is not possible to manufacture optimum thermopiles that directly produce the voltages required for many applications.

The reason why it is not possible to manufacture such thermopiles with most commonly used thermoelectric materials is that these materials frequently do not have sufficient mechanical strength to allow their failure-free manufacture into thermoelements with the extreme ratio of length to cross-sectional area required of thermopiles that produce high voltages at low values of power output. As a result, it is usual to manufacture thermopiles that produce either much less than the required voltage at the desired power output or a much greater than required power output at the desired voltage. In both cases, it is the conversion efficiency of the thermoelectric generator that is penalized.

In the former case, it is necessary to use a voltage converter to convert the lowr direct output voltage to the value desired. In the conversion process, power is lost in the voltage converter and therefore the thermopile must be designed to produce more than the final required power in order that adequate power be available after voltage conversion. In the latter case, in which a much greater than required power output is produced, conversion efficiency is lost because a proportionately greater amount of heat is required to power the generator. In addition to a loss in conversion efficiency, in both cases the generator size must be increased to accommodate the greater fuel requirements; generator cost very likely also increases for the same reason.

Commonly used heat sources in thermoelectric energy conversion consist of burners that burn various fossil fuels, radioactive materials that produce heat upon their decay, either focused or unfocused solar heat, heat produced by nuclear reactors, and the waste heat of a variety of engines. The thermopile used in conjunction with any of such conventional heat sources operates between the temperature of the heat source and the temperature of a heat exchanger that rejects waste heat into ambient environment of the thermoelectric generator. The cold side heat exchanger operates at a temperature lower than that of the heat source and higher than that of the ambient environment. The thermopile of most lower power thermoelectric generators, those that produce electrical power in the microwatt or the milliwatt range, is generally a monolithic matrix wherein the individual thermocouples are either mechanically or metallurgically attached to each other through intermediate layers of electrical insulation. The electrical interconnects between thermoelements and thermocouples are generally located in the two extremities of the thermopile. The electrical output leads of the thermopile emanate from the two end-most thermocouples in the thermopile. The reason for the inclusion of the thermoelements and thermocouples in a monolithic matrix is that because of the extreme ratio of length to cross-sectional area, individual thermoelements tend to be extremely weak mechanically. The cross-sectional area of individual thermoelements is generally extremely small because the thermopile size constraints limit the thermoelement height. Even with this type of thermopile construction, there is usually a limit as to how small thermoelement cross-sectional areas can be made with most commonly used thermoelectric materials. As already discussed, this limit restricts either the maximum obtainable voltage at a given level of power output or the minimum obtainable power output at a given voltage. A typical low power thermoelectric generator that uses radioisotopes as a heat source is illustrated in FIG. 1. It should be noted that radioisotopes are probably the most widely utilized heat source in totally self-contained, long-life miniature thermoelectric generators that produce power in the range of microwatts and milliwatts.

Basically, every material is a thermoelectric material in that it possesses the three properties commonly used to define a thermoelectic material: the Seebeck coefficient, electrical resistivity, and thermal conductivity. As already mentioned, the conversion efficiency obtainable from a thermoelectric material is proportional to a quantity known as the Figure-of-Merit. The Figure-of-Merit of a material is defined as the quotient of the square of the Seebeck coefficient and the product of electrical resistivity and thermal conductivity. As a result of extensive research, it has been found that as a general class, the most efficient thermoelectric materials are extrinsic semiconductors. Although metals and insulators, as well as intrinsic semiconductors, can all be used to convert heat to electrical power, the conversion efficiencies obtainable with those materials are significantly lower than the conversion efficiencies obtainable with extrinsic semiconductors. Even in the broad class of extrinsic semiconductors, wide divergencies exist between the ability of different materials to convert heat to electricity, i.e. wide differences exist in the figures-of-merit, hence conversion efficiency obtainable with different extrinsic semiconductors.

The most commonly used extrinsic semiconductors in thermoelectric energy conversion are compounds and alloys that include Bismuth and Tellurium, Lead and Tellurium, and alloys of Silicon and Germanium. Most of the thermoelectric materials based on these material combinations are inherently intrinsic; extrinsic characteristics are obtained by these materials as a result of doping with appropriate impurities to yield n-type and p-type conductivity. Occasionally, although infrequently, use is made of metals in the form of very fine wires, to produce electrical power thermoelectrically. Although metals are relatively inefficient thermoelectric materials, they do afford the obtainment of a high ratio of thermoelement length to cross-sectional areas and thereby enable the obtainment of a high direct output voltage from thermoelectric generators designed to produce low values of power output. The conversion efficiency, however, is so poor compared to extrinsic semiconductors that a significant penalty is paid in terms of required fuel loading and/or device size. For this reason, there is an obvious advantage to the use of the just-mentioned commonly used compounds and/or alloys in the production of thermopiles designed to produce small amounts of electrical power, even though as explained such thermopiles usually are unable to produce high direct output voltages.

Each of the three general class of extrinsic thermoelectric materials commonly used in the production of electrical power from heat has traditionally occupied a definite place in the overall field. The figures-of-merit and maximum operating capabilities of each group of materials differ widely. Bismuth-Telluride and compounds and alloys that utilize it are basically low temperature materials that cannot reliably be operated at temperatures in excess of some 250° to 300° C. It does, however, possess the highest known figure-of-merit of any material at low temperatures, those in the neighborhood of room temperature. Lead-Telluride and compounds and alloys that utilize it are relatively higher temperature materials that can be operated up to about 500° to 600° C. The figure-of-merit of materials based on Lead-Telluride are somewhat lower than those materials based on Bismuth-Telluride. Silicon-Germanium alloys are capable of operation up to about 1000° C. Their figures-of-merit are somewhat lower than those of materials based on Lead-Telluride. In general, because the conversion efficiency of a thermoelectric device is proportional to both the figure-of-merit and the temperature difference across which the thermoelectric material is operated, it is found that the three general groups of extrinsic semiconductors enable the manufacture of thermopiles and thermoelectric generators that exhibit relatively comparable conversion efficiencies.

When the conversion efficiencies of thermoelectric generators are optimized, it is usually found, relatively independent of the thermoelectric material used, that the hot side temperature of the thermopile at optimum generator efficiency is a function of generator power level such that the lower the power desired from the generator, the lower the hot side temperature at which generator efficiency optimizes. In general, the conversion efficiencies of thermoelectric generators designed for the low milliwatt power output range possess thermopile hot side temperatures of some 300 to 400° C or less at optimum values of conversion efficiency. In the high microwatt power output range, thermopile hot side temperatures that correspond to optimum efficiency are generally less than 200° C. Because alloys and compounds based on Bismuth-Telluride and those based on Lead-Telluride, but especially the former, possess the highest known figures-of-merit of all commonly used thermoelectric materials at such temperatures, it may seem obvious that it is these materials that should be used in low power thermoelectric generators. Based on considerations that only address themselves to the conversion efficiency of a thermoelectric generator, this conclusion is inescapable and, in fact, forms the basis of much of the state-of-the-art of low power thermoelectric generator technology. Although the conversion efficiency of thermoelectric generators that use alloys and compounds of Lead and Bismuth-Telluride are relatively high, at the very lowest power levels, in the low milliwatt and microwatt power range it is not generally possible to obtain sufficiently high direct output voltage values to satisfy the requirements of most applications of the generators. Accordingly, it is not uncommon to over-design these generators from the standpoint of electrical power produced with the view of using either a voltage converter to enchance the output voltage or to obtain the voltage directly at the higher power level.

As already explained above, the end result of such a procedure is a power conversion system that is not really optimized either for efficiency or size. If a voltage converter is used, the reliability of the overall power conversion system is also penalized because of the addition of an electronic component in the system. The reason that it is not possible to obtain an adequate voltage output from low power thermoelectric generators that use alloys and compounds of Lead and Bismuth-Telluride as their thermoelectric material, is that these materials are relatively brittle and weak and therefore do not lend themselves to manufacturing procedures that enable the production of thermoelements with sufficiently extreme ratios of length to cross-sectional area.

SUMMARY OF THE INVENTION

The above and other disadvantages of prior art low power thermoelectric generator technology are overcome by the present invention of a low power, small dimensioned, thermoelectric generator using Silicon-Germanium alloys and the method of manufacturing it comprising the steps of sawing n and p-type Silicon-Germanium alloy ingots into parallelepipeds, cutting the n and p-type Silicon-Germanium alloy parallelepipeds into slices, surface finishing both large faces of each slice so that both of the large faces of each slice are parallel to each other, cleaning the slices, coating at least one large face of each slice with a glass powder, the glass having a softening point above the intended operational temperature of the thermopile, a high resistivity, and a linear thermal expansion coefficient which approximately matches that of the Silicon-Germanium alloy, and sintering each glass-coated slice at a temperature close to the softening temperature of the glass to locally bond the glass powder particles to each other and to the slice. Thereafter each glass-coated slice is stacked with another glass-coated slice so that a glass layer occurs between the two Silicon-Germanium alloy slices. This sandwich structure is then placed in an air furnace and fired to a temperature sufficiently high that the glass will bond the two slices together with an intermediate glass layer. Thereafter the sandwich structure outer, large faces are surface finished down to the point that the total sandwich structure has a predetermined desired thickness. The purpose of doing the surface finishing after the Silicon-Germanium alloy slices are bonded to the glass layer is that the slices are surface finished to a point where they would break if they did not have the support at the intermediate glass layer.

At least one face of each surface finished sandwich is covered with glass powder and a plurality of the glass powder-covered sandwich structures are stacked in a predetermined arrangement of conductivity types depending upon the type of thermopile desired. This sandwich stack is then placed in a furnace and heat bonded until the intermediate glass layers fuse and hold the Si-Ge layers together. This fused structure is then sliced perpendicularly to the laminations to produce a laminate structure. Interconnections between elements of opposite conductivity types within the laminate slice are then made to give the desired voltage and power requirements for the thermopile structure. Contacts are also made on the cold end of the laminate-structured thermopile to provide the voltage output.

Where it is desired that the thermopile have extremely small dimensions, the laminate slice is reprocessed according to the steps of the above method as though it were the original Silicon-Germanium alloy slice. In this reprocessing operation all the slicing is done perpendicular to the laminations to produce an extremely small thermopile.

In some embodiments it is preferable to coat the Silicon-Germanium alloy material prior to each glass coating operation with a special wetting agent to enchance the wetting and adherence between the glass and the Silicon-Germanium alloy. In one preferred embodiment this wetting coating is applied by mens of a chemical vapor deposition of Silicon-Nitride, $Si_3N_4$, on all of the large surfaces of the slices. This coating can be applied to a variety of thickness but is preferably applied to have a thickness of 2500 angstroms. In some instances, it is also desirable to chemically vapor-deposit a coating of Silicon-Dioxide, $SiO_2$, on top of the Silicon-Nitride layer. The Silicon-Dioxide layer can also have a variety of thicknesses although a thickness of 2000 angstroms is generally adequate.

In order to prevent bridging between the interconnections on the ends of the thermopile, it is preferable that prior to the interconnection step the ends of the thermopile are lapped and then coated with a glass powder which is thereafter heat bonded to the structure. The coated thermopile ends are then relapped and the steps repeated until no voids or imperfections are uncovered during the lapping process.

In one preferred embodiment the interconnections are made by means of separate Silicon-Germanium covering elements which may either be applied as a single layer and then etched in the desired pattern or may be deposited through a mask in the desired pattern. The entire thermopile is preferably potted in glass to provide insulation and to protect the thermopile from deleterious substances in the environment. In one preferred embodiment the output lead wires to the thermopile are provided by placing metal wires or ribbons in two output slots cut in the cold end of the thermopile and heating the thermopile and the metal wires to the lower of two temperatures at which the metal forms a eutectic with the Silicon and Germanium alloy. This results in a partial reaction between the metal and the Silicon-Germanium alloy to provide good electrical contacts.

Although the figure-of-merit of Silicon-Germanium alloys is considerably lower than those of compounds and alloys of Lead and Bismuth-Telluride at low temperatures, temperatures at which optimum conversion efficiency occurs for thermoelectric generators in the low milliwatt and microwatt power range, it has been found that the significantly more advantageous mechanical and strength properties of Silicon-Germanium alloys more than compensate for this. In the above described method of the invention, the individual thermoelements possess extreme ratios of thermoelement length to cross-sectional area; ratios greater by one to two orders of magnitude than those possible for any of the known compounds and alloys based on Lead and Bismuth-Telluride. Using this manufacturing process, it is possible to manufacture thermopiles that can produce a direct voltage output adequate to meet most requirements in the low milliwatt and microwatt power ranges.

Even though the conversion efficiency of Silicon-Germanium alloys is basically lower than that obtainable from alloys and compounds of Lead and Bismuth-Telluride, the difference is not as great as may be thought on the basis of a comparison of material figures-of-merit. The reason for this is that the thermopile hot side temperature at optimum conversion efficiency is slightly greater for Silicon-Germanium alloy thermopiles than it is for thermopiles based on the other materials. This means that the conversion efficiencies of thermopiles based on the various technologies are not as far apart as may be thought strictly on the basis of material figures-of-merit. More importantly, however, all differences in thermoelectric generator conversion efficiency are totally obviated by the fact that low power generators based on Silicon-Germanium alloys produce their voltage directly, without the need to use a voltage converter or the need to produce excess power just so that an adequate voltage can be developed. As pointed out above, both of the latter procedures result not only in penalized power conversion system efficiencies, but also in penalized power conversion system sizes and reliabilities. It has been found that the conversion efficiency of low power thermoelectric generators that use Silicon-Germanium alloys are comparable to those that use the other thermoelectric materials on the basis of overall power system considerations. What gives low power thermoelectric generators that use Silicon-Germanium alloys a clear advantage over all others is that such generators do not require the production of power tht is lost in an attempt to obtain an adequate voltage output. This advantage manifests itself in a generally smaller total power conversion system size and enchanced system reliability. In many applications of thermoelectric generators, such as those used for implantable medical devices and miniature communications sytems, these advantages become crucial. Although low power Silicon-Germanium thermoelectric generators that produce fairly high direct output voltage values have been manufactured before, it has not been possible even with silicon-germanium alloys, to extend the range of low power output values with concurrent high direct voltage capabilities, to power output levels in the very low milliwatt and microwatt ranges. The present invention enables this to be accomplished.

It is therefore an object of the invention to provide an extremely small semiconductor thermopile having high direct voltage in the low milliwatt and microwatt ranges.

It is another object of the invention to provide a method for fabricating extremely small thermoelements and thermopiles from semiconductor materials without breaking the semiconductor materials in the process.

The foregoing and other objectives, features and advantages of the invention will be more readily understood upon consideration of the following detailed description of certain preferred embodiments of the invention, taken in conjunction with the accompanying drawings.

FIG. 2 is a perspective view of an ingot of silicon-germanium alloy when cut into a parallelepiped and a slice;

FIGS. 3A–3F are vertical views, in section, of the process steps according to one method of the invention;

FIG. 4 is a perspective view of the structure depicted in FIG. 3F when cut into slices;

Figure 1:
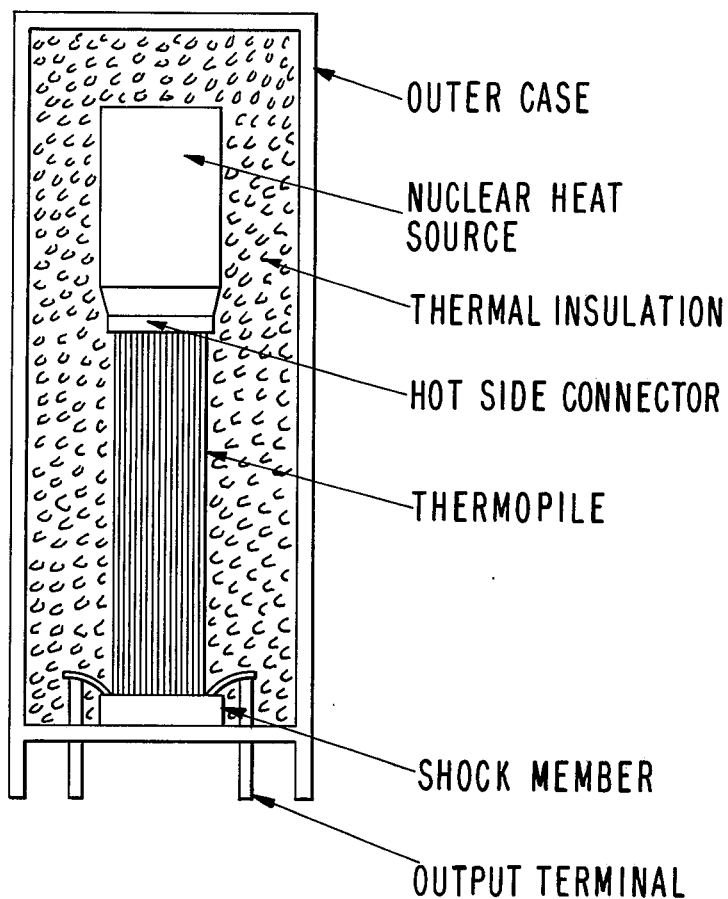
FIG. 1 is a vertical, sectional view of a prior art, low power thermoelectric generator which uses a radioisotope as a heat source.
Figure 6:
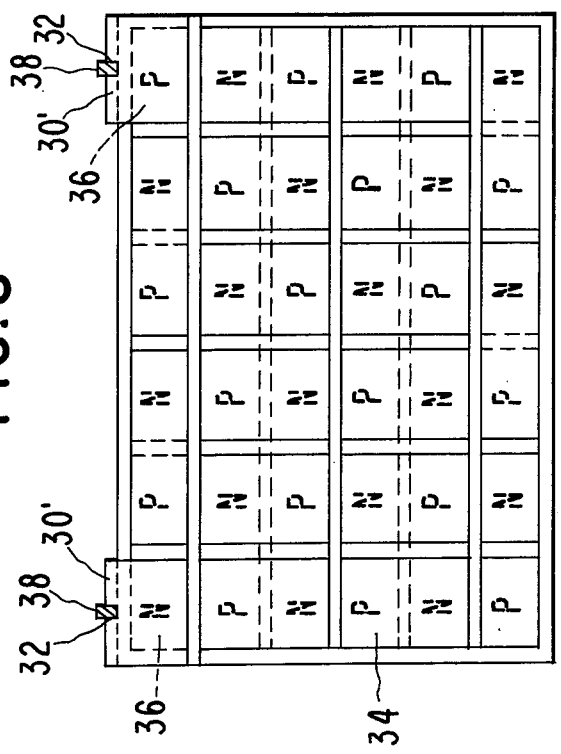
Figure 7:
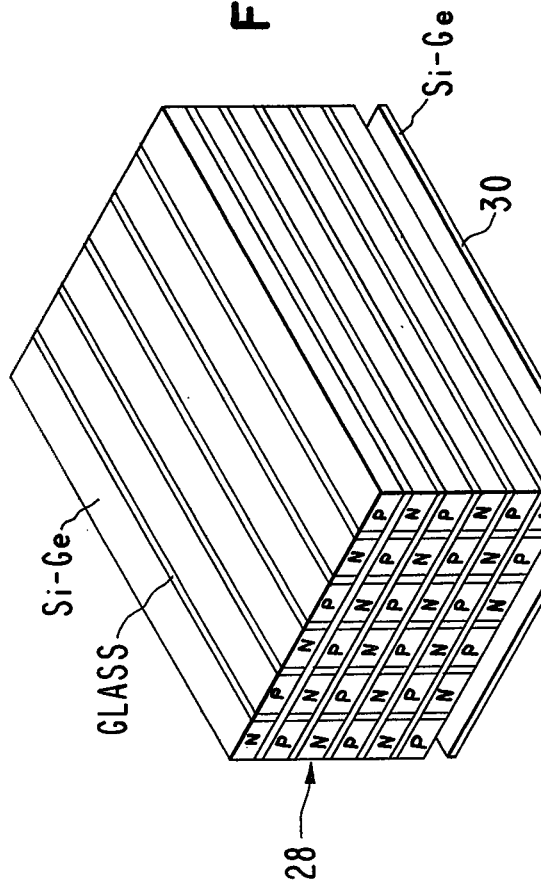
Figure 8:
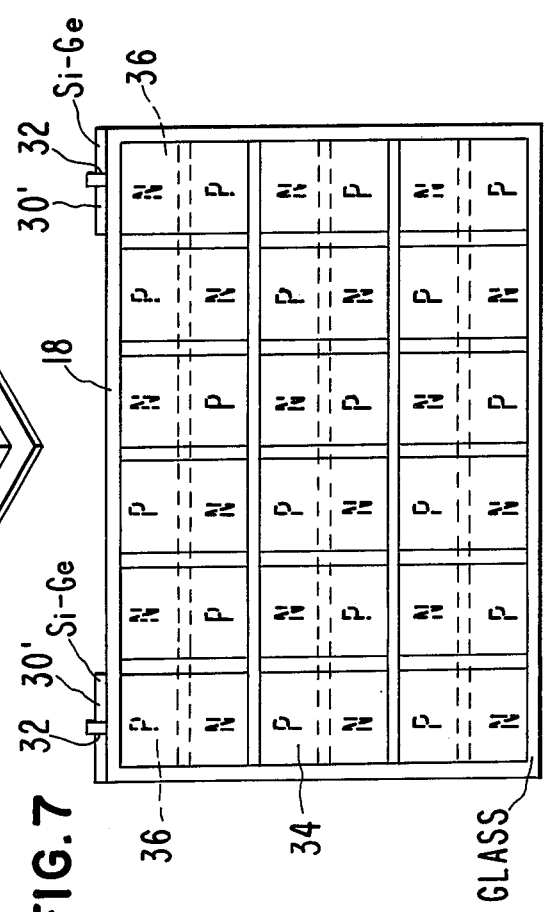

FIGS. 5A–5F, inclusive, are vertical views illustrating the steps in a modified method according to the invention;

FIG. 6 is a perspective view of a thermopile according to the modified method of the invention;

FIG. 7 is a vertical view of the hot end of the thermopile depicted in FIG. 6 together with a portion of the interconnections; and FIG. 8 is a vertical view of the cold end of the thermopile depicted in FIG. 6 together with certain of the interconnections and the output leads.

DETAILED DESCRIPTION OF CERTAIN PREFERRED EMBODIMENTS

Referring now more particularly to FIG. 2, the method of the invention is begun by sawing n- and p-type silicon-germanium alloy ingots 10 into parallelepipeds 12 with dimensions adequate to make more than the number of thermoelements of a desired design configuration required of a given thermopile. It is necessary to allow for a number of thermoelements more than needed for a thermopile to compensate for various process losses. The dimension of the parallelepiped in the direction of the eventual thermoelement length should be longer than the final thermoelement length in order to allow for some off-setting of different thermoelements in the length-direction that occurs during various manufacturing steps. The thickness and width of the parallelepipeds should be sufficient to enable subsequent slicing into the proper number of slices adequate for the proper number of thermoelements in any given row of the finished thermopile.

The silicon-germanium raw material used may consist of any alloy of silicon-germanium in whatever form, including, but not limited to, melt-grown material, pressed-powder material, and vacuum cast material. The silicon-germanium alloy is doped to yield n-type and p-type conductivity characteristics at any and all levels of doping, using any doping material whatsoever. Both the n-type and p-type silicon-germanium alloy ingots are sawed into the parallelepipeds.

The parallelepipeds 12 of n- and p-type silicon-germanium alloy are next sliced into thicknesses 14 slightly greater than the design thickness of the thermoelements in the thermopile. If the design thickness of theremoelements is significantly below the value to which the silicon-germanium parallelepiped can be reproducibly sliced with adequate yield, i.e., without undue loss from breakage, the parallelepipes are cut into slices of thicknesses that can be obtained with a good yield, even though this thickness may be much greater than the design thickness of the thermoelements.

Using any surface finishing technique whatsoever, including mechanical lapping, both sides of each n- and p-type silicon-germanium slice 14 are surface finished such that the large faces 16 of each slice possess a good surface finish and such that the two large faces 16 of each slice are essentially parallel. Assuming that the design thickness of the thermoelements in the thermopile is less than that of the slices that can be reproducibly handled without undue breakage, the individual n- and p-type slicon-germanium alloy slices are surface finished to a thickness that is adequate for handling without undue breakage, even though the final thickness will be appreciably greater than the design thickness of the thermoelements.

Using known cleaning methods, such as chemical, mechanical, and/or thermal cleaning methods, the slices 14 are cleaned such that the surfaces 16 of the individual slices are free of any extraneous contaminants, such as may be caused by normal handling and/or the preceding processing steps, including films due to coolants and/or abrasives used during processing.

Depending on the electrical insulating material to be used for the bonding of the individual silicon-germanium alloy slices into a thermopile, it may be desired to apply a special surface coating to the slices 14 to enhance wetting and adherence between the electrical insulator and the silicon-germanium alloy. If this is desired, a known chemical vapor deposition method should be used to deposit a coating of silicon nitride, $Si_3N_4$, on all of the large surfaces of the slices. Although this coating can be applied to a variety of thicknesses, it has been found that a thickness of 2,500 angstroms is usually adequate. In some instances, it is also desirable to chemically vapor-deposit a coating of silicon-dioxide, $SiO_2$, on top of the silicon-nitride layer. If this is the case, the silicon-dioxide layer can be a variety of thicknesses, although it has been found that the thickness of 2,000 angstroms is usually adequate. It should be noted that although chemical vapor depposition has been used successfully for the deposition of the silicon-nitride and/or dioxide coatings, it is possible to accomplish this by other methods.

A slurry of glass powder and a liquid vehicle are next prepared. The glass powder can consist of any glass that is desired to be used as the electrical insulator in the thermopile. In this context, a glass is defined as a solid substance that contains silicon-dioxide as one of its major constituents. It may also contain other constituents, such as other oxides. Although many glasses may be used for this purpose, it is important that the glass possess a linear thermal expansion coefficient that reasonably matches that of the silicon-germanium alloy used in the thermopile and that the softening temperature of the glass be higher than the highest temperature at which the thermopile will eventually be operated in its intended application. The electrical resistivity of the glass used should be as high as possible in order that it be an effective electrical insulator; its thermal conductivity should be as low as possible so that heat losses of the final thermopile be minimized.

Glasses that have been successfully used in silicon-germanium alloy thermopiles include, but are not limited to, types EE2 and EE9 manufacutred by Owens-Illinois, type CV635 manufactured by Kimble and type 1720 manufactured by Corning. Although a variety of particle sizes may be used, it is best to use glass powder of as small a particle size as conveniently available, certainly much smaller than the final thickness of the electrical insulator separating the thermoelements of the thermopile.

The liquid vehicle of the slurry can be any liquid chemical that does not chemically react with the glass or silicon-germanium alloy. It should be a chemical that evaporates without a residue. One suitable chemical is a dilute solution of nitrocellulose in amyl acetate.

The proportion of the glass and liquid vehicle in the slurry may be varied; the method of the application of the slurry to silicon-germanium alloy slices normally determines the composition of the slurry. In case the slices are mechanically coated by the application of the slurry onto each slice, the slurry is normally quite thick and paste-like. If a sedimentation technique is used for coating the silicon-germanium alloy slices, the slurry consists of a relatively dilute suspension of glass in the liquid vehicle.

The slurry 18 may be applied to the slices of silicon-germanium alloy by pouring it and/or mechanically spreading it on at least one large face 16 of each of the slices 14 to a thickness greater than the final thickness desired of the electrical insulator in between individual thermoelements of the finished thermopile (FIG. 3A). The slices 14 thus coated are allowed to dry such that the liquid vehicle of the slurry 18 evaporates leaving the glass particles behind. A blading technique is used to dry-blade glass-coated slices 14 to a uniform thickness such that the top surface of the glass coating 18 is parallel with the surface 16 of the silicon-germanium alloy slice 14. This procedure is normally adequate if a glass thickness of several mils or greater is desired to the electrical insulator in the finished thermopile. If a smaller thickness is desired to reduce heat loss, it is common to use the following sedimentation technique for the application of the glass.

In the sedimentation technique a dilute slurry, i.e., a slurry with a very high ratio of the amount of liquid vehicle to that of the glass, is placed in a container that contains the silicon-germanium alloy slices 14 spread over its bottom in such a way that the individual slices do not cover each other. The liquid vehicle is allowed to evaporate. The glass particles suspended in the liquid vehicle will then deposit uniformly over the bottom of the container, including the silicon-germanium alloy slices 14 located on it. The thickness of glass 18 applied to the slices 14 can be varied according to the amount of glass originally placed in the liquid vehicle and the amount of liquid vehicle placed in the container. During this process, it is important not to disturb the slurry during evaporation and to maintain the top surfaces 16 of the silicon-germanium slices 14 exactly perpendicular to the vertical. This assures uniformity of coating thickness and parallelism of the top surface of the coating with the surfaces of the silicon-germanium alloy slices and obviates the need for additional mechanical treatment of the slices.

In still other alternative methods, the glass 18 may be applied to the silicon-germanium alloy slices 14 in the form of a tape or thin sheet or by a deposition technique such as sputtering or by chemical deposition. If the glass is applied mechanically, such as by means of glass tape or sheet, the glass should be temporarily affixed to the silicon-germanium alloy slices by means of a bonding agent that evaporates and/or decomposes in subsequent processing without leaving a residue.

Referring now to FIG. 3B, in order to facilitate the handling of the slices, each glass-coated slice of silicon-germanium alloy is sintered at a temperature close to that of the softening temperature of the glass used. This sintering step is performed in an air furnace; the slices are heated to the neighborhood of the softening temperature of the glass such that the individual glass particles locally bond to each other and to the silicon-germanium surface. The intent of this step is only to facilitate handling and not to attain the total bonding that normally follows the complete melting of the glass. The heating time used in this step is normally just long enough, of the order of a few minutes, to accomplish the purpose of this step.

A first seal composite of silicon-germanium alloy slices and glass is next prepared. Assuming that the thickness of the individual thermoelements in the finished thermopile is less than the thickness of the glass coated silicon-germanium alloy slices 14, an uncoated silicon-germanium alloy slice is placed on top of a coated slice such that the glass layer 18 occurs between the tow silicon-germanium alloy slices 14 (FIG. 3C). All of the glass coated slices are made into sandwich structures 20 of this type. The sandwich stacked silicon-germanium alloy slices 20 are placed into suitable bonding fixtures and the stack and bonding fixtures are placed in an air furnace. A modest weight is placed on top of each sandwich or laminate stack 20 and the stack is heated to a temperature higher than the softening temperature of the glass. The stack is maintained at the final firing temperature for a period of time adequate to assure the melting of the glass and bonding of it to the silicon-germanium alloy slices. The use of a weight on top of the stack 20 facilitates contact between the individual layers of glass and silicon-germanium alloy, and thereby generally improves the quality of bonding. In some cases, it may be possible to accomplish this step without the use of a weight. The sandwich or laminate stack 20 is thereafter cooled back to room temperature at such a rate that the possibility or cracking as a result of any differences in the thermal expansion between the silicon-germanium alloy slices and the glass is minimized.

After the heat-bonding of the sandwich structures, these structures are treated as individual silicon-germanium alloy slices in subsequent processing. Prior to that being done, however, the silicon-germanium alloy on either side of the glass layer in the center of the sandwich structure is reduced in thickness by an effective surface finishing method such as lapping or etching so that each of the silicon-germanium alloy slices comprising the sandwich structure 20 attains the final thermoelement design thickness (FIG. 3D). It is important that the reduction of the silicon-germanium alloy thickness is accomplished in such a way that parallelism between the two silicon-germanium alloy faces of the sandwich structure 20 is maintained. The sandwich structure is then subjected to the above described processing steps of cleaning and glass coating as if it were a silicon-germanium alloy slice by itself (FIG. 3E). The result of these processing steps is that one face of each silicon-germanium alloy sandwich structure now possesses a glass coating. The various sandwich structures 20 with their surface coatings of glass 18 are thereafter stacked in the following manner. The sandwich slices are stacked together in such a way that the glass coating 18 on any given silicon-germanium alloy slice 14 is adjacent to the uncoated side of the silicon-germanium alloy of the adjacent slice (FIG. 3F). In other words, the sandwich slices are stacked such that the silicon-germanium alloy and glass layers alternate. In addition, the slices are preferably stacked such that n- and p-type silicon-germanium slices have a periodicity of one or more, depending on the final circuit arrangement desired of the finished thermopile. For example, if all thermoelements of the thermopile are to be placed electrically in series, the slices should be stacked so that n- and p-type slices alternate. A series-parallel circuit arrangement in the finished thermopile requires the stacking of the silicon-germanium alloy slices in such a way that two slices of the same polarity alternate with two slices of the opposite polarity. Higher degrees of circuit redundancy can obviously be built into the thermopile by using still other stacking sequences for the silicon-germanium alloy slices in this step. This desired polarity configuration should also be taken into account in the original formation of the sandwich or laminate slices 20. The number of slices in this stack 22 should be the same as the final number of thermoelements desired along any one direction of the finished thermopile.

When the silicon-germanium alloy sandwich slices are stacked in the manner here described, one side of the stack 22 exposes the uncoated side of one endmost silicon-germanium alloy slice while the other side of the stack 22 exposes the glass coated side of the other endmost silicon-germanium alloy slice. An uncoated silicon-germanium alloy slice is then placed at the end of the stack 22 that has the glass coated side of the endmost slice exposed. The result is that now both ends of the stack have silicon-germanium alloy facing outward (FIG. 3F).

The stack may be processed as such or it may be processed after electrical insulators are placed at both ends of the stack 22. If electrical insulators are used, they are usually thin slices having essentially the same lateral dimensions as the silicon-germanium alloy slices in the stack. They are coated on one side with the same or similar glass as the glass used in the stack 22. The coated faces of the insulators are placed in contact with the endmost silicon-germanium alloy slices in the stack such that the glass coating is in between each electrical insulator and the endmost silicon-germanium alloy slice in the stack 22. Although many other materials, either glasses or ceramics, may be used as electrical insulators at the ends of thestack, it has been found that thin sheets of Pyroceram are quite satisfactory for this purpose.

This stack is then heat bonded in the same manner as described above in reference to the heat bonding of the sandwich stacks. 20. It should be noted that although a glass of different composition may be used in the original formation of the sandwich structure than the glass used in the formation of the first seal assembly, it has been found that this is not necessary; in fact, glass of exactly the same composition may be used for both steps. In other words, the subjugation of the bond forming the sandwich structures to the bonding sequence used in the formation of the first seal assembly is generally not adversely affected by it.

Depending on the desired size of the thermopile, appropriate interconnections may now be made between the ends of the thermoelement slices 14 to give the desired series or parallel connected combinations of the thermoelements. For extremely small thermopiles, however, the above steps must now be repeated on the stack 22 as though it were one of the original ingots 10 depicted in FIG. 2. Thus, the stack 22 is cut into slices 24 perpendicularly to the laminations (FIG. 4). These slices are cleaned and coated with glass powder 18 (FIG. 5A) which is thereafter heat sintered (FIG. 5B). A glass coated laminate slice 24 is then sandwich-stacked with an uncoated laminate slice (FIG. 5C) and the two are heat bonded together in the above described manner.

The resulting sandwich-laminate or first seal composite slice 26 is thereafter surface finished, as by lapping, to the desired thickness (FIG. 5E). As mentioned above, the use of the intermediate glass layer allows the silicon-germanium elements to be made much thinner than would otherwise be possible. The repetition of the stacking process described in reference to FIG. 3F results in a second seal composite or finished uncontacted thermopile 28 (FIG. 5F). In preparing the first seal composite slices for the second seal processing, care must be taken in properly aligning the slices 26 into the stack 28 prior to its final bonding. At this point, it is important to align the n-type and p-type thermoelements of alternate first seal slices in such a way that the final thermoelement sequence desired in the thermopile is accurately obtained. For example, if all of the thermoelements in the final thermopile are to be placed electrically in series, it is necessary that n-type and p-type thermoelements alternate when the first seal slices are stacked into a second seal composite. The glass used in bonding the first seal slices into a second seal composite may be the same as that used in preparing the first seal composite. It may, however, also be a different glass, one that has a lower softening temperature than the glass used in the preparation of the first seal composite.

In the repetition of final stacking process step prior to the completion of second seal composites, one of the electrical insulators, such as Pyroceram, side pieces is replaced by a thin slice of silicon-germanium alloy of either polarity type. This slice 30 should have a thickness comparable to or slightly greater than the electrical insulator at the other end of the stack. In either case, its thickness should be minimized although it may have a thickness greater than individual thermoelement thicknesses. Prior to its sealing on the second seal composite 28, the silicon-germanium slice 30 is treated in a manner analogous to the electrical insulator slices 18; the treatment consists of the coating of one side of the slice 30 with glass in a manner analogous to that of the electrical insulator slice and according to the above described process. The finished second seal composite 28, therefore, has an electrical insulator 18 on three of its lateral faces, with the fourth one being the slice of silicon-germanium alloy (FIGS. 6, 7 and 8).

The two ends of the second seal composite 28 are next lapped in such a way that the two ends are parallel to each other and so that the structure ends up having a total length equal to that desired of the thermoelements of the finished thermopile. The two ends of the thermopile thus to be treated are the ones that contain the exposed ends of the individual silicon-germanium alloy thermoelements. While the lapping is being performed, it is important to continuously inspect the thermopile for imperfections and voids either in the glass or at all glass and silicon-germanium interfaces at both ends of the thermopile. If voids or defects are noticed at either end of the thermopile prior to the attainment of its design length, it is necessary to subject the thermopile to a so-called patching sequence. This sequence involves the covering of the end of the thermopile in question with a thin layer of glass using an application technique similar to any of the previously mentioned techniques, bonding of the glass to the end of the thermopile by means of an air furnace run that takes the thermopile to a temperature higher than the softening temperature of the glass used. The glass layer is subsequently lapped to once again expose the ends of the individual thermoelements. At this point, the original voids or imperfections should be sealed with the additional glass introduced. If this is not the case, the patching may have to be done a second or even more times. The process is repeated until the thermopile is at its design length and until all voids and defects are reduced to tolerable levels. The glass used in the patching sequence may either be the same as used in the thermopile or it may be a glass possessing a lower softening temperature than that used in the thermopile. The purpose of this patching step is to remove any voids in the structure which would otherwise cause undesirable bridging between the thermoelement ends when the interconnections are made.

The Si-Ge layer 30 is thereafter removed by etching, sandblasting, or the like, to provide two side contact regions 30' at the cold end of the thermopile. These end contact regions are located over the end theremoelements in the series circuit which is to be constructed. They are isolated from them, however, by the glass layer 18. In order to provide for output leads, slots 32 are cut longitudinally in the contact regions 30' (FIGS. 7 and 8). These slots 32 should be cut in such a manner that they do not totally sever the silicon-germanium alloy slice 30', penetrating only partway through the total thickness of the slice.

The individual thermoelements of the thermopile must be interconnected into an electrical circuit. The electrical circuit can be either a series circuit in which all thermoelements are connected electrically in a series or it can be a circuit with multiple redundancy in which the various thermoelements are interconnected in some arrangement resulting in a series-parallel electrical circuit. There are two basic methods for interconnecting the thermoelements. These two methods are described below in Parts A and B of this process.

A. Inasmuch as most metals form relatively low temperature eutectics with silicon-germanium alloys or chemically react with them at high temperatures, it is necessary to contact the individual thermoelements at one or both of the ends of the thermopile by means of semiconductor contacts if one or both ends of the thermopile are intended for use at temperatures that exceed the capabilities of metal to silicon-germanium alloy contacts. A semiconductor contact for two silicon-germanium alloy thermoelements makes use of either silicon, germanium, or any alloy of silicon and germanium. In each of these cases, the contacting material, be it silicon, germanium, or an alloy of silicon and germanium, is usually doped to yield high values of electrical conductivity. Even though this is usually done, it is not absolutely necessary if the contact is intended for use at an elevated temperature because the materials just mentioned possess high values of electrical conductivity even in their intrinsic state at high temperatures. Two basic methods exist for attaching such semiconductor contacts to the ends of the thermopiles. The first method makes use of the evaporation, sputtering, or chemical deposition of the material directly onto the end of the thermopile. The evaporated, sputtered, or chemically deposited layer must have a thickness sufficient to minimize the electrical resistance of the contacting layer. Although no absolute criterion exists for this thickness, as a general rule, the electrical resistance of the interthermoelement contacts should be as low as possible, certainly no more than some ten percent of the total thermoelement resistances. In order that adherence of the evaporated, sputtered, or chemically deposited layer be as great as possible, it is important to observe utmost cleanliness. For example, if the contacting materials are sputtered to the ends of the thermopile, it is common to perform a back-sputtering operation prior to the deposition of the contacting material. Inasmuch as the evaporated, sputtered, or chemically deposited layer of material is continuous across the end of the thermopile, it is necessary to separate this layer into individual interthermoelement contacts or electrodes. This can be accomplished in any of several different ways. For example, the initial deposition of the contacting material can be performed through a mask that permits the material to deposit at only predetermined places at the ends of the thermopile. If this is done, the mask is prepared by photoetching techniques prior to the deposition. It is also possible to photoetch the complete layer of material at the ends of the thermopile by using standard masking and photoetching techniques. Alternatively, a continuous layer of any of the contacting materials at the ends of the thermopile can be separated into circuit patterns by mechanical means such as carefully controlled sandblasting, scribing, or slotting.

The second method of applying semiconductor contacts to the ends of the thermopile makes use of either silicon or germanium or an alloy of silicon and germanium in the form of a very thin sheet, or a thickness of the order of a few mils up to a few tens of mils. The silicon or the silicon-germanium alloy can be doped, although it does not necessarily have to be. The sheet of this material, which is obtained by slicing, lapping, or etching, is subjected on one of its sides to the deposition of germanium by either evaporation, sputtering, or chemical deposition methods. The germanium layer is deposited to a thickness of a few thousand angstroms to a few microns and may be doped to high electrical conductivity but does not necessarily have to be. In place of the germanium, it is also possible to use an alloy of silicon and germanium with the only provision being that this alloy have a higher germanium content than the sheet of material on which it is deposited, if that sheet is, in fact, an alloy of silicon and germanium. The sheet of material with its layer of germanium or silicon-germanium alloy on one side is contacted to the ends of the thermopile in one of two ways. First, a section of it exactly the size of the end of the thermopile may be placed over the ends of the thermopile and pressure-loaded with weights or springs in such a way that a moderate pressure forces contact between the sheets at the ends of the thermopile and the thermopile itself. The sheet is placed such that the coating of germanium or silicon-germanium is on one side of the sheet facing the thermopile. This assembly is then placed into a vacuum or inert atmosphere furnace and heated to a temperature slightly in excess of the melting temperature of germanium or of the silicon-germanium alloy layer that covers the contacting sheet, depending on which material is used as a coating on the contacting sheets. The furnace run is conducted for only a few minutes, just long enough for the coating on the contacting sheets to melt upon cooling to room temperature. Contacting sheets at the ends of the thermopile are now bonded to the thermopile.

Circuit patterns 34 are inscribed at the ends of the thermopile by any of the techniques previously described. Namely, mechanical slotting, sandblasting, or scribing, may be used. Whatever technique is used, a previously made mask is useful in this process inasmuch as the individual thermoelements are now hidden from view. The second way of attaching the semiconductor sheet contacts 34 to the ends of the thermopile is to mechanically separate the sheet that has been coated with either germanium or an alloy of silicon-germanium into individual contact pads exactly of the size required. The sheet may be separated into these pads by any convenient process of either mechanical slotting, sawing, slicing, or etching techniques or any other. The individual contact pads are placed over the ends of the thermopile in their prescribed position, whereby they contact two or more individual thermoelements depending on the circuit redundancy desired of the thermopile. The pads are placed such that the coating of germanium or silicon-germanium alloy is on the side of the pad facing the thermopile. In order to mechanically affix the contact pads to the thermopile prior to bonding, it is common to make use of a fastening agent to keep the individual contacting pads in place. The fastening agent should decompose or evaporate during the bonding cycle without leaving any residue. With the contacting pad in place, at one or more ends of the thermopile, pressure is placed on the contacting pads to force them into intimate contact with the thermopile during bonding. The pressure can be applied either by weights or springs. The thermopile is then subjected to a bonding sequence in a vacuum or inert atmosphere furnace by heating the thermopile to a temperature higher than the melting temperature of the coating of germanium or silicon-germanium alloy on the contacting pads. Cooling of the thermopile back to room temperature yields a bond between the contacting pads and the thermoelements of the thermopile.

B. An alternate method for the electrical interconnection of the thermoelements in the thermopile makes use of metal contacts rather than the semiconductor contacts discussed above. Any metal that does not melt or form a low melting eutectic with the silicon-germanium alloy or glass of the thermopile at or below the highest temperature at which the thermopile is intended to be used or further processed, can potentially serve as a contacting material. Although it is sometimes desirable to select metals that possess linear thermal expansion coefficients reasonably close to those of the silicon-germanium alloy and glass of the thermopile, this is not actually necessary. The electrical resistivity of the metal should be quite low, but any deficiency in this regard can be effectively eliminated by the use of thicker metal layers. Generally, the metal and metal to silicon-germanium alloy resistances of a thermopile should be very low compared to resistances of the thermoelements. The metal can be applied to the two ends of the thermopile in any of several ways. For example, a metal layer of the thickness of a few microns or more can be applied by chemical deposition, evaporation, or sputtering. It can also be applied in the form of thin sheets that are placed over the ends of the thermopile, pressure-loaded to the thermopile end-faces, and reacted in a vacuum or inert atmosphere furnace at a temperature sufficient to form a bond between themselves and the silicon-germanium alloy thermoelements. In all of these cases, it is necessary to define the desired circuit pattern by removing the metal from all areas of the thermopile end-faces at which it is not desired. This can be accomplished by the use of either mechanical or chemical means, such as slotting, sandblasting, or photoetching. It is preferable to utilize various masking techniques for this purpose. Alternatively, the thermopile end-faces may be metallized through a mask that already yields the form of the desired circuit pattern. In the case of bulk metal contacts, the individual contact pads can be individually prepared and placed on the ends of the thermopile in their desired locations, temporarily affixed by means of an agent that decomposes or evaporates without leaving a residue, pressure-loaded and then bonded to the silicon-germanium alloy thermoelements by means of an inert atmosphere or vacuum furnace run at an appropriate temperature.

In all cases, it is necessary to observe procedures of utmost cleanliness. Good contacting is usually most effectively accomplished if the surfaces to be contacted are as clean as possible. For this reason, for example, in the case of sputtered contacts it is best to backsputter the two ends of the thermopile prior to the application of the metal. Chemical, mechanical, and thermal cleaning procedures may also be used. It is sometimes found that when a metal is deposited onto a semiconductor surface at a temperature lower than that at which reaction occurs between the metal and the semiconductor, it is subsequently necessary to heat the metal and semiconductor interface to a temperature at which reaction does occur in order that a low electric resistance result in the interface. This is especially true of contacts formed by sputtering, evaporation, or chemical deposition and, as a result, it is sometimes necessary to heat the contacted thermopile to appropriate temperatures for a short time in an inert atmosphere or vacuum furnace so that low electrical resistance contacts are possible. The interthermoelement contacts are arranged so that all thermoelements are in a desired circuit pattern, either in series, or in series-parallel. The endmost thermoelements 36 of the circuit are contacted to the ends 30' of the silicon-germanium alloy slice bonded to the side of the thermopile. The common metals used for the contacting of the thermoelements of thermopiles include, but are not limited to, tungsten, molybdenum, nickel, iron and aluminum.

In order to protect the electrical circuits at the ends of the thermopile, electrical insulation layers are bonded over these circuits such that they are totally electrically isolated from the external surfaces of the thermopile, except for the output leads or output surfaces (those portions of the silicon-germanium alloy slice on the side of the thermopile that are electrically connected to the circuit). This is accomplished by one of several methods. A layer of glass 18 can be deposited over the ends of the thermopile by means of chemical deposition or sputtering and possibly even by means of evaporation. Alternatively, it is possible to apply glass to the ends of the thermopile by the above described techniques relating to the application of the glass powder and then forming a bond by heating the thermopile past the softening temperature of the glass. Although this step can be accomplished in a vacuum or inert atmosphere furnace, it is more properly done in an air furnace because glasses tend to decompose when melted or softened in an oxygen deficient atmosphere. It has been found that even in the case of metal contacts that are extremely sensitive to oxidation, such as contacts that consist of refractory metals, the sealing of thermopile ends can be successfully accomplished in an air environment without adversely affecting the contacts.

An alternate method for electrically isolating the circuit patterns at the ends of the thermopile makes use of thin substrates of silicon-germanium alloy, silicon, or any other high temperature material, such as Pyroceram. The substrate is coated with glass, as in the above described process. The glass is sintered onto the substrate and the substrate is placed over the ends of the thermopile such that the glass layer lies inbetween the substrate and the electrical circuit at the ends of the thermopile. Pressure is applied to the substrate/thermopile interface by means of weights or springs and the whole structure is subjected to a furnace run at temperatures higher than the softening temperature of the glass used on the substrate. This bonding cycle is again most effectively performed in an air furnace.

The glass used for sealing the ends of the thermopile can be any glass that is compatible with the materials in its immediate environment in the thermopile, and that has a softening temperature equal to or less than the softening temperatures of other glasses in the thermopile. In fact, it can be one of the same glasses already used in the thermopile. When the ends of the thermopile have been sealed according to the process here described, it is sometimes desired to make the ends completely flat and/or parallel to each other. This can be done by any convenient method, such as mechanical lapping or an appropriate chemical treatment.

If desired, electrical output leads 38 can be attached to the thermopile. This is usually, but not always, done because it is possible to use pressure-contacted output leads that do not form an integral part of the thermopile. If output leads are attached, they can be attached by one of two methods. The first method consists of the placement of the ends of two metal wires or ribbons on the partial slots 32 on the silicon-germanium alloy slice 30' and affixing them by mechanical means such as epoxies, cements, or spring clips. Even the mechanical forcing of the ends of the output leads into the slots may be adequate to hold them in place. It is important that each lead wire 38 be in electrical contact with its silicon-germanium alloy slice 30' in order that they serve as effective output terminals. The insertion of a metal layer or paste, inbetween the lead wires and the silicon-germanium alloy slice, such as indium metal or an electrically conductive paste, sometimes enhances contact between the lead wires and the silicon-germanium alloy slice.

The second method of attaching output lead wires to the thermopile consists of the placement of metal wires or ribbons 38 in the two output slots 32 and heating the thermopile to the lower of the two temperatures at which the metal forms a eutectic with silicon and germanium. This results in partial reaction between the metal and the silicon-germanium alloy and results in good electrical contacts. Pressure is sometimes applied to the interface of the metal lead wires and silicon-germanium alloy during the heating cycle. This process can normally be performed in either air, vacuum or inert atmosphere.

Sometimes a layer of glass is placed on top of the lead wires prior to the heating cycle in order to take advantage of the additional strength accorded to the junction of wires and silicon-germanium alloy by bonding of the glass to the silicon-germanium alloy that surrounds the lead wires when the wires are placed in the slots. The glass used for this purpose should have a softening temperature equal to or lower than the lowest temperature at which the metal wires form a eutectic with the silicon-germanium alloy slice. The glass is preferably applied as in the above described process steps and may be applied in sufficient quantity to completely cover the silicon-germanium alloy output pads at the side of the thermopile. In this way, the whole outer surface of the thermopile, except for the output leads themselves, is electrically isolated from the internal circuit. Although practically any metal may be used for the output leads, the metals preferably used are tungsten, platinum, nickel and iron.

A somewhat different and alternative method for the attachment of output leads to the thermopile involves a modification to the process used in the bonding of second seal composites. Instead of replacing one of the insulators at the sides of the second seal stack with a slice of a silicon-germanium alloy, the second seal stack is assembled with all insulators in place. As explained above, the electrical insulators are covered on one side with a glass coating and it is this side of each insulator that is placed adjacent to the silicon-germanium alloy and glass composite slices of the second seal stack. The second seal composite is then processed as described above.

Following the completion of the second seal composite processing, two small diameter metal wires are bonded to one of the two electrical insulators, the ones at the top and bottom faces of the second seal composite. The bonding is performed such that the two wires are parallel to each other, although separated, and extend in the same direction as the thermoelements in the thermopile. The two wires are bonded along a relatively short distance along the side of the thermopile; the bonded region is, however, of sufficient length to accord the wires adequate mechanical attachment to the side of the thermopile. The bond region is located close to one end of the thermopile, with the wires completely imbedded in the glass used in the bonding. The glass used for this purpose may be any glass that has a softening temperature equal to or lower than that of the lowest softening temperature glass used in the rest of the thermopile. The unbonded ends of the wires extend from the thermopile at a point at the side of the thermopile; these ends of the wires are used as the output terminals. Upon completion of the bonding of the two wires, the thermopile is subjected to lapping. Upon completion of this step, along with intermittent end patching, if necessary, the ends of the two metal wires should be even with the surface of one end of the thermopile and should be visible.

During the circuit interconnection step described above these output leads are connected to the appropriate thermoelements. It should be noted that only metallized thermoelement interconnections are possible at the end of the thermopile that has the output wires of this process step. The other end of the thermopile can, however, utilize semiconductor interconnects, if desired. If a silicon-germanium alloy slice is bonded to one face of the thermopile, it is possible to utilize semiconductor thermoelement interconnects at both ends of the thermopile. As before, although practically any metal may be used for the two metal wires bonded to the side of the thermopile, the metals preferably used are tungsten, platinum, nickel and iron.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

The method of the invention is further illustrated by the following example:

1. Hot pressed n- and p-type 80 a/o Si - 20 a/o Ge alloy are sawed into parallelepipeds of dimensions of 0.96 × 0.60 × 0.51 inch. The silicon-germanium alloy, both n-type and p-type, is doped with phosphorus and boron, respectively, to possess a room temperature electrical resistivity of about one milliohm-centimeter.

2. The n- and p-type silicon-germanium alloy parallelepipeds are then cut into slices of dimensions of 0.008 × 0.96 × 0.51 inch.

3. The n- and p-type silicon-germanium alloy slices are lapped to dimensions of 0.0065 × 0.96 × 0.51 inch.

4. All slices are sequentially cleaned ultrasonically in the following solvents: distilled water, isopropyl alcohol and trichlorethylene.

5. Type CV 635 glass made by Kimble is thereafter pulverized by ball milling into powder of particle size finer than −400 mesh.

6. A slurry of glass powder and liquid vehicle is prepared by mixing the glass powder with ethyl acetate and isopropyl alcohol in the following proportions: 17 ml each of isopropyl alcohol and ethyl acetate and 0.671 grams of glass.

7. Six of the n-type silicon-germanium alloy slices are then mounted on a 0.025 inch thick alumina plate that has a lateral surface area sufficiently large to accommodate all six slices such that the slices do not overlap. The alumina plate has 18 protrusions of 0.010 inch height on its surface; the silicon-germanium alloy slices rest on these protrusions such that three protrusions support each slice. The slices are mechanically affixed with thinned KMER brand photoresist made by Eastman Kodak to the protrusions and cured at 150° C in air for 30 minutes (the KMER decomposes and disappears during subsequent sintering operation).

8. The mounted silicon-germanium alloy slices and alumina plate are placed on the bottom of a cylindrical Pyrex brand glass dish that has an inner diameter of 6.4 cm and a height of 1.0 cm.

9. The glass and liquid vehicle slurry are poured into the Pyrex dish and the dish is placed into an ultrasonic shaker for sedimentation of glass on silicon-germanium alloy slices in the dish.

10. When glass sedimentation is complete, the liquid vehicle of the slurry is allowed to evaporate; this is accomplished rapidly by placing the dish under a heat lamp.

11. The glass coating on the silicon-germanium alloy slices still mounted on alumina plate is sintered by heating the slices in an air furnace at 625° C for seven minutes.

12. Six sandwich structures are then made by placing six uncoated p-type silicon-germanium alloy slices on top of the glazed surfaces of the six n-type silicon-germanium alloy slices that were sintered in the preceding step.

13. The sandwich structures are bonded by placing them in an air furnace at 690° C for 30 minutes. During the bonding cycle a stainless steel weight of 271 grams is placed on top of each sandwich structure.

14. Each bonded sandwich structure is thereafter lapped such that the thickness of both of the silicon-germanium alloy slices of each sandwich is 0.0015 inch and such that the large lateral surfaces of the sandwich are parallel (the glass layer of each sandwich will be about 0.002 inch thick).

15. Process Steps 6 to 11 are next repeated with the six sandwich structures, making sure that the glass is deposited on the n-type slice of the silicon-germanium alloy.

16. The Process Steps 6 to 15 are then repeated with a sufficient number of n- and p-type silicon-germanium alloy slices to fabricate the final thermopile, allowing for some loss of material during processing.

17. A block of type 1720 glass made by Corning is then sawed into two plates with dimensions of 0.96 × 0.51 × 0.0885 inch.

18. A slurry is prepared as in Process Step 6.

19. One side of each of the two type 1720 glass slices is coated as in Process Steps 7 to 11.

20. A stack of ten sandwich structures is next formed such that the glazed side of each sandwich structure is adjacent to the unglazed side of the neighboring sandwich and such that the bottom-most sandwich has its unglazed side facing outward. An unglazed sandwich is placed on top of the stack. The two glazed slices of type 1720 glass are placed on top and bottom of the stack such that the glazing is adjacent to the end-most sandwiches of the stack.

21. The stack of sandwiches and type 1720 glass slices is bonded in an air furnace at 690° C for 30 minutes, with a stainless steel weight of 271 grams on top of the stack.

22. The Process Steps 1 to 16 are repeated with the stack bonded in Process Step 21; the stack now takes the place of the silicon-germanium alloy parallelepipeds of Process Step 1. Slicing of the stack in Process Step 2 is performed in a direction perpendicular to the large surfaces of the silicon-germanium alloy slices in the stack.

23. Two slices of silicon-germanium alloy are cut to dimensions 0.96 × 0.2545 × 0.010 inch and are each coated on one side with type CV 635 glass according to the Process Steps 6 to 11.

24. The sandwich structures obtained from Process Step 22 are stacked in the same way as in Process Step 20 except that the type 1720 glass end-plates now are replaced by the silicon-germanium alloy slices of Process Step 23 and instead of 11 sandwich structures, the stack now has 12 sandwich structures. During the stacking, the polarity type of the thermoelements is chosen to alternate in any vertical line of thermoelements when going from the bottom to the top of the stack.

25. The stack of Process Step 24 is bonded according to the Process Step 21, except the weight of 271 grams is replaced with a weight of 216 grams.

26. The ends of the thermopile are next lapped such that the thermopile attains a length of 0.8 inch in the direction of thermoelements.

27. If voids exist at thermoelement and glass interfaces at the ends of the thermopile, more type CV 635 glass is deposited by sedimentation on the ends of the thermopile and the glass is bonded by firing in an air furnace at 690° C for 30 minutes. The ends of the thermopile are lapped again to expose the ends of thermoelements. This process step is repeated until the number and size of voids is minimized.

28. The two silicon-germanium alloy slices are slotted at the two opposite sides of the thermopile by making five equally spaced transverse saw cuts (perpendicular to the thermoelements) and one vertical saw cut (parallel to thermoelements) into each slice such that each slice is completely severed at each saw cut, but the cut does not penetrate beyond the glass separating the silicon-germanium alloy slices from the rest of the thermopile.

29. A photographic mask of a series electrical circuit for each end of the thermopile is prepared such that all of the thermoelements are placed electrically in series and the circuit terminates with the two silicon-germanium alloy slices on the two lateral faces of the thermopile.

30. The two ends of the thermopile that expose the ends of the thermoelements are backsputtered in an ultra-high vacuum environment for 20 minutes. A 1.5 micron thick layer of tungsten is then sputtered across each end.

31. Using standard photoetching techniques, the tungsten on each end of the thermopile is etched into the desired electrical circuit pattern by removing all undesired tungsten.

32. Two slices of silicon-germanium alloy of lateral dimensions equal to those of the ends of the thermopile and of 0.0665 inch thickness are prepared and each slice is coated on one side with type CV 635 glass according to Process Steps 6 to 11.

33. The slices of silicon-germanium alloy are fired at 670° C for 5 minutes in an air furnace.

34. The silicon-germanium alloy slices are bonded to the two ends of the thermopile in an argon atmosphere at 690° C for 30 minutes with a weight of 100 grams placed on the thermopile during the bonding.

35. The two sides of the thermopile that have the type 1720 glass slices bonded to them are lapped such that the type 1720 glass thickness is reduced from 0.0885 inch to 0.005 inch. The two sides of the thermopile that have the slotted silicon-germanium alloy slices bonded to them are then lapped such that the silicon-germanium alloy slice thickness is reduced to 0.005 inch. The two ends of the thermopile are finally lapped such that the silicon-germanium alloy slices at the ends of the thermopile are totally eliminated, without the glass originally between these slices and the ends of the thermopile being reduced in thickness.

36. The output voltage is obtained either by pressure contacts or by providing slot mounted output leads in the manner described above in reference to FIG. 8.

While in the description above it was recited that in order to reduce the silicon-germanium slices to the proper thinness it is necessary to form a sandwich structure of Si-Ge slices bonded on either side of an intermediate glass layer which provides the necessary structural rigidity to withstand the lapping operation, in other, alternative methods only the laminate structure 26 needs to be subjected to this sandwich-lapping step; laminate structure 26 having been originally made by the conventional method to have relative thick dimensions.

One important advantage of being able to make a thermopile of such small size is that the differences in the linear coefficients of thermal expansion of the different materials becomes less important since the materials are so thin that they are relatively ductile. Thus silicon can be used to make the interthermoelement connections whereas in larger thermopiles this is not practicable.

Although the thermoelements of the invention are described and shown above as being square in cross-section in other embodiments, they may be rectangular in cross-section. It may also be desirable in some applications to balance the differing resistivities of the n- and p-conductivity type thermoelements by having a different cross-sectional area for one type than the other.

In some less advantageous embodiments the Si-Ge slices can be lapped to the desired thinness simply by bonding a supporting glass layer to one side of the slice prior to the lapping. This is actually only a modification of the sandwich-lapping step described above.

In still other less advantageous, low temperature application embodiments of the invention other types of high resistivity insulators, such as expoxies, can be substituted for the glass used in the above described method.

What is claimed is:

1. A method of manufacturing a thermopile using silicon-germanium alloys comprising the steps of sawing n- and p-type silicon-germanium alloy materials into parallelepipeds, cutting the n- and p-type silicon-germanium alloy parallelepipeds into slices, surface finishing both large faces of each slice so that both of the large faces of each slice are parallel to each other, cleaning the slices, coating at least one large face of each slice with a glass powder, the glass having a softening point above the intended operational temperature of the thermopile, a high resistivity, and a linear thermal expansion coefficient which approximately matches that of the silicon-germanium alloy, sintering each glass-coated slice at a temperature close to the softening temperature of the glass to locally bond the glass powder particles to each other and to the slice, stacking each glass-coated slice with another slice so that a glass layer occurs between the two silicon-germanium alloy slices to form a sandwich stack, heating each sandwich stack to a temperature at which the glass bonds the two slices together with an intermediate glass layer, surface finishing at least one of the outer, large faces of each heat-bonded sandwich stack down to the point that the total sandwich stack has a predetermined desired thickness, covering at least one face of each surface-finished sandwich stack with glass powder, stacking a plurality of the glass powder-covered individual sandwich stacks in a predetermined arrangement of conductivity types depending upon the type of thermopile desired to form a first seal assembly, heating this first seal assembly until the intermediate glass layers fuse and hold the silicon-germanium alloy layers together, slicing this fused structure perpendicularly to the laminations to produce a laminate structure, and interconnecting the ends of the laminated silicon-germanium elements of opposite conductivity types to form a thermopile having a predetermined voltage and power output.

2. The method as recited in claim 1 further comprising the steps of reprocessing the laminate structure prior to the interconnecting step according to the method steps of claim 1 as though the laminate structure were the original silicon-germanium alloy material, with all of the slicing being done perpendicularly to the laminations.

3. The method as recited in claim 1 further comprising the steps of coating the silicon-germanium alloy material prior to each glass coating operation with a special wetting agent to enhance the wetting adherence between the glass and the silicon-germanium alloy.

4. The method as recited in claim 3 wherein the wetting agent coating step comprises chemical vapor depositing silicon-nitride, $Si_3Ni_4$, on all of the large surfaces of the slices.

5. The method as recited in claim 4 further comprising the step of chemically vapor depositing a coating of silicon-dioxide, $SiO_2$, on top of the silicon-nitride layer.

6. The method as recited in claim 1 wherein prior to the interconnecting step the ends of the thermopile are lapped and then coated with a glass powder which is thereafter heat bonded to the structure and relapping the glass coated thermopile ends and repeating the glass coating and lapping steps until no voids or imperfections are uncovered during the lapping process in order to prevent bridging between the interconnections on the ends of the thermopile.

7. The method as recited in claim 1 wherein the interconnecting step comprises bonding separate silicon containing elements to the ends of the thermopile elements.

8. The method as recited in claim 1 wherein the interconnecting step comprises bonding metal elements to the ends of the thermopile elements, the metal elements having thermal coefficients of expansion at least twenty percent different than the thermal coefficient of expansion of the silicon-germanium alloy.

9. The method as recited in claim 1 wherein the interconnecting step comprises affixing metal elements to the ends of the thermopile elements and heating the assembly to a temperature sufficient to at least partially react the metal with the silicon-germanium alloy to develop a low electrical resistance, ohmic contact between the metal and the thermoelements.

10. The method as recited in claim 1 further comprising the step of potting the entire thermopile in an electrical insulator to provide insulation and to protect the thermopile from deleterious substances in the environment.

11. The method as recited in claim 1 further comprising the step of slotting one side of the thermopile, placing metal wires or ribbons in the slots, and heating the thermopile and the metal wires to the temperature at which the metal forms a eutectic with the silicon-germanium alloy.

12. The method as recited in claim 1 further comprising the steps of bonding separate metal leads to at least one side of the thermopile such that one end of each lead is flush with one end of the thermopile and connecting the flush end of each lead to separate thermoelements.

13. A semiconductor thermopile constructed by the method recited in claim 1 such that the thickness of each silicon-germanium alloy thermopile element is on the order of 1.5 mils, which thickness is obtained during the step of surface finishing the two slice sandwich stacks.

14. A method of manufacturing a thermopile using silicon-germanium aloys comprising the steps of sawing n- and p-type silicon-germanium alloy material into parallelepipeds, cutting the n- and p-type silicon-germanium alloy parallelepipeds into slices, surface finishing both large faces of each slice so that both of the large faces of each slice are parallel to each other, cleaning the slices, coating one large face of each slice with an insulator, the insulator having a high resistivity, bonding the insulator to the slice, surface finishing the outer, uncoated large face of each bonded, insulator coated slice down to the point that the slice has a predetermined desired thickness, stacking a plurality of the insulator covered individual slices so that the slices are separated from one another by a layer of the insulator between them and in a predetermined arrangement of conductivity types depending upon the type of thermopile desired to form a first seal assembly, bonding this first seal assembly so that the intermediate insulator layers hold the silicon-germanium alloy layers together, and interconnecting the ends of at least a portion of the laminated silicon-germanium elements of opposite conductivity types to form a thermopile having a predetermined voltage and power output.

* * * * *